(12) United States Patent
Merchant et al.

(10) Patent No.: US 6,364,744 B1
(45) Date of Patent: Apr. 2, 2002

(54) CMP SYSTEM AND SLURRY FOR POLISHING SEMICONDUCTOR WAFERS AND RELATED METHOD

(75) Inventors: Sailesh Mansinh Merchant; Sudhanshu Misra; Pradip Kumar Roy, all of Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/496,829

(22) Filed: Feb. 2, 2000

(51) Int. Cl.[7] .......................... B24B 49/00; B24B 51/00
(52) U.S. Cl. ........................ 451/6; 451/41; 451/287
(58) Field of Search .................. 451/5, 6, 8, 41, 451/43, 268, 269, 285, 287, 288, 397, 398

(56) References Cited

U.S. PATENT DOCUMENTS

| | | | |
|---|---|---|---|
| 5,728,308 A | 3/1998 | Muroyama | 216/88 |
| 5,775,980 A * | 7/1998 | Sasaki et al. | 451/60 |
| 5,879,226 A * | 3/1999 | Robinson | 451/60 |
| 5,916,855 A | 6/1999 | Avanzino et al. | 51/307 |
| 6,159,073 A * | 12/2000 | Wiswesser et al. | 451/6 |
| 6,177,026 B1 * | 1/2001 | Wang et al. | 252/79.1 |

* cited by examiner

Primary Examiner—Derris H. Banks
(74) Attorney, Agent, or Firm—Allen, Dyer, Doppelt, Milbrath & Gilchrist, P.A.

(57) ABSTRACT

A chemical mechanical polishing (CMP) system includes a polishing device including a polishing article. The polishing device provides relative movement between the semiconductor wafer and the polishing article with a slurry therebetween. The slurry preferably includes abrasive particles and a photocatalyst to enhance oxidation of metal of the semiconductor wafer. The slurry may also include water and the photocatalyst is a mixed metal oxide for breaking down water into hydrogen and oxygen in the presence of light.

32 Claims, 3 Drawing Sheets

CM P SYSTEM AND SLURRY FOR POLISHING SEMICONDUCTOR WAFERS AND RELATED METHOD

FIELD OF THE INVENTION

The present invention relates to semiconductor processing, and, more particularly, to planarizing or polishing semiconductor wafer surfaces during the manufacture of integrated circuits.

BACKGROUND OF THE INVENTION

Semiconductor devices, also called integrated circuits, are mass produced by the fabrication of identical circuit patterns on a single semiconductor wafer. During the process, the wafer is cut into identical dies or chips. Although commonly referred to as semiconductor devices, the devices are fabricated from various materials, including conductors (e.g. copper, aluminum and tungsten), non-conductors (e.g. silicon dioxide) and semiconductors (e.g. silicon). Silicon is the most commonly used semiconductor, and is used in either its single crystal or polycrystalline form. Polycrystalline silicon is often referred to as polysilicon or "poly". The conductivity of the silicon is adjusted by adding impurities in a process commonly referred to as doping.

Within an integrated circuit, thousands of devices (e.g., transistors, diodes) are formed. Typically, contacts are formed where a device interfaces to an area of doped silicon. Specifically, plugs are typically formed to connect metal layers with device active regions. Vias are typically formed to connect metal layers with other metal layers. Also interconnects are typically formed to serve as wiring lines to interconnect the many devices on the integrated circuit and the many regions within an individual device. These contacts and interconnects are formed using conductive materials.

The integrated circuit devices with their various conductive layers, semiconductive layers, insulating layers, contacts and interconnects are formed by fabrication processes, including doping processes, deposition processes, photolithographic processes, etching processes and other processes. At certain steps, it is often desirable to achieve a pre-determined level of surface planarity, uniformity, and/or roughness. It is also desirable to minimize surface defects such as pits and scratches. Such surface irregularities may affect the performance of the final semiconductor device and/or create problems during subsequent processing steps.

One common technique to planarize a wafer is known as chemical mechanical polishing (CMP). CMP is very widely used technique which delivers a slurry of material to the wafer surface and while a polishing pad or belt is passed over the wafer surface. The slurry typically includes a plurality of abrasive particles dispersed in a liquid. For example, U.S. Pat. No. 5,728,308 entitled "Method of polishing a semiconductor substrate during production of a semiconductor device" discloses a conventional slurry used for chemical mechanical polishing including abrasive particulates comprised of metal oxides such as silica ($SiO_2$), alumina ($Al_2O_3$), titanium oxide ($TiO_2$), and cerium oxide ($CeO_2$) of a particle size of about 10 nm in an aqueous solution of potassium hydroxide (KOH).

Typical slurries also include stabilizers, one or more oxidizing and/or complexing agents, and a suspension agent or surfactant. A conventional surfactant, or surface wetting agent, may include an emulsion comprising mostly water, and also include fat/oils and alcohols/iso-alcohols, for example. The fat/oil serves to keep the abrasive particles in suspension.

A semiconductor wafer typically includes a dielectric layer and numerous metal layers which may include tungsten, aluminum, copper, tantalum, titanium, titanium nitride, tantalum nitride or any other metal commonly used in the production of integrated circuits. In conventional CMP processes for polishing metal layers of a wafer, metal removal rates are limited by the rate of metal oxidation. Therefore, typical slurries include oxidizers to oxidize the metal because the metal oxides polish faster compared to the pure metal. Also, for CMP of copper layers, for example, because metal removal rates are limited by the rate of metal oxidation, corrosion inhibitors are necessary in the slurry to prevent corrosion of the copper layer before oxidation.

SUMMARY OF THE INVENTION

In view of the foregoing background, it is therefore an object of the present invention to enhance the removal rates of CMP for metal layers of the semiconductor wafer.

It is another object of the present invention to provide a slurry which does not require corrosion inhibitors for CMP.

These and other objects, features and advantages in accordance with the present invention are provided by a chemical mechanical polishing (CMP) system for polishing a semiconductor wafer including metal. The system comprises a polishing device including a polishing article support, and a polishing article held by the polishing article support for relative movement with the semiconductor wafer. A slurry is provided at an interface between the polishing article and the semiconductor wafer, and the slurry comprises abrasive particles and at least one mixed metal oxide to enhance oxidation of the metal of the semiconductor wafer. The system preferably includes a light source providing light at the interface between the polishing article and the semiconductor wafer. The slurry may include water and the at least one mixed metal oxide is a photocatalyst for breaking down water into hydrogen and oxygen in the presence of light.

The light provided by the light source is preferably ultraviolet and the light source may be positioned adjacent the polishing article support opposite the polishing article. Thus, at least portions of the polishing article support and the polishing article may be transparent. Also, the light source may be carried by the polishing article support.

The at least one mixed metal oxide preferably comprises at least one of $SrTiO_3$, $CeTiO_3$, $BaTiO_3$, and $(Sr_xBa_{1-x})TiO_3$ and may include an NiO coating. The slurry may be acidic with the at least one mixed metal oxide being soluble in the slurry. Alternatively, the slurry may be alkaline with the mixed metal oxide being insoluble in the slurry. Here, the mixed metal oxide may comprise abrasive particles.

The objects, features and advantages in accordance with the present invention are also provided by a method of chemical mechanical polishing a semiconductor wafer including metal. The method including the steps of providing relative movement between the semiconductor wafer and a polishing article, providing light at the interface between the polishing article and the semiconductor wafer, and delivering a slurry to the interface between the semiconductor wafer and the polishing article. The slurry preferably comprises abrasive particles and at least one photocatalyst to enhance oxidation of the metal of the semiconductor wafer. The slurry further comprises water, and the photocatalyst comprises a mixed metal oxide for breaking down water into hydrogen and oxygen in the presence of light.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
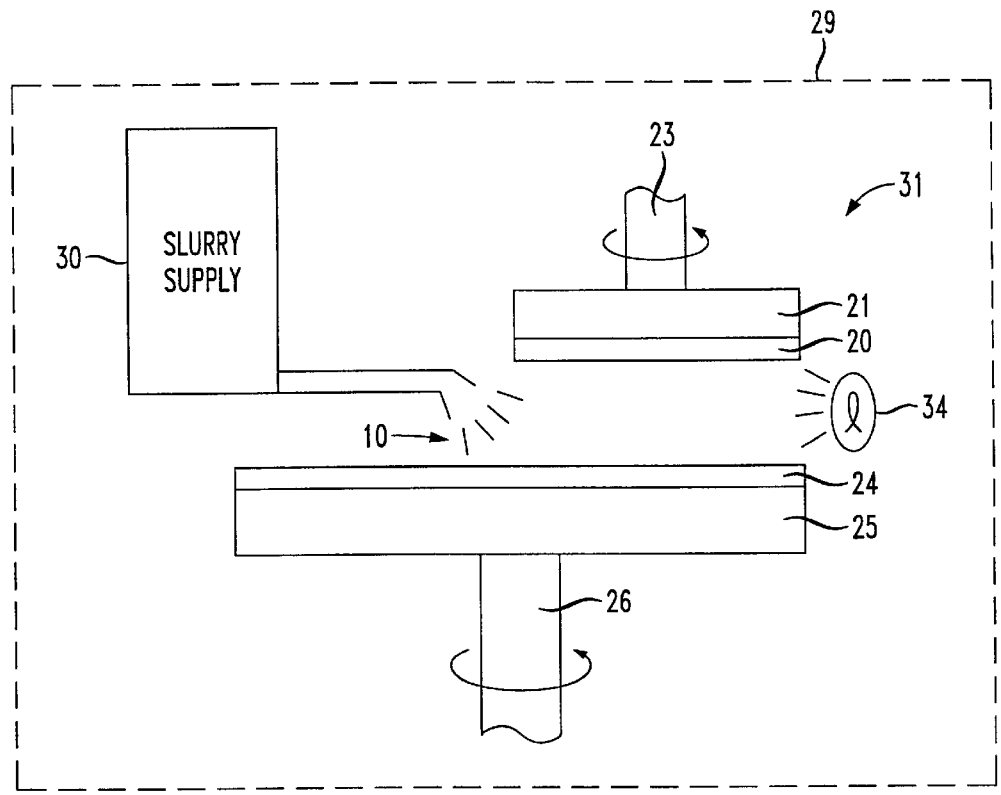
FIG. 1 is a schematic diagram of a CMP system in accordance with an embodiment of the present invention.
Figure 3:
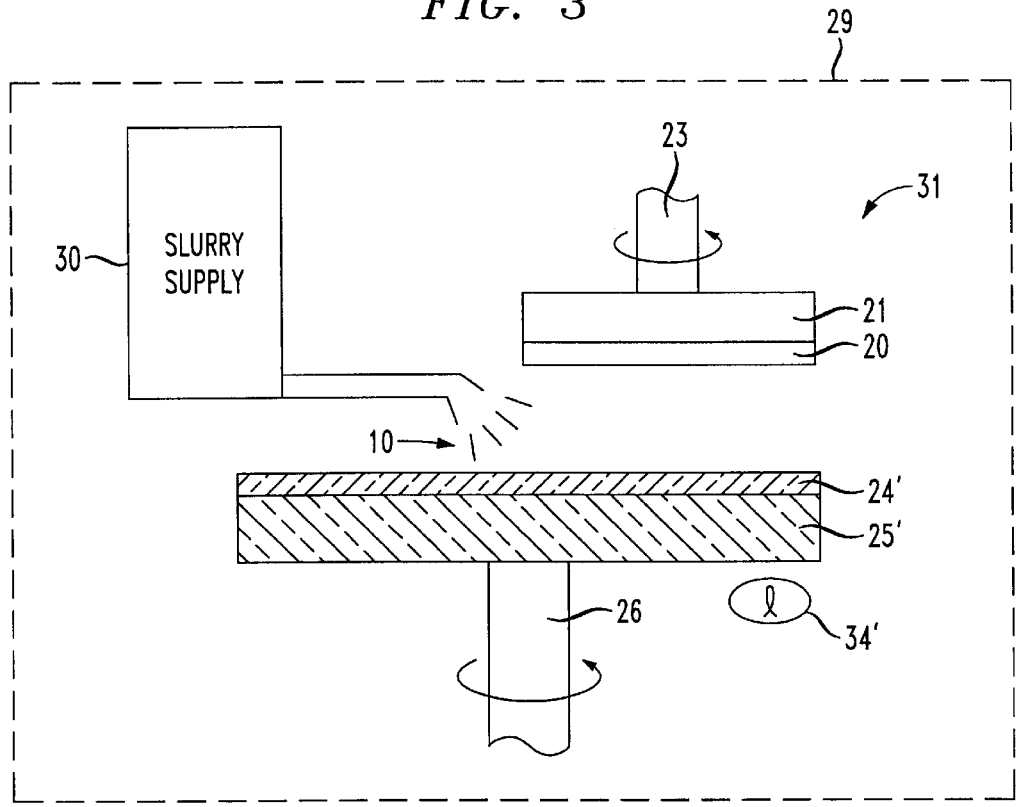
FIG. 3 is a schematic diagram of a CMP system in accordance with another embodiment of the present invention.

Referring initially to FIGS. 1 and 3, a system 29 and a method for CMP, in accordance with the present invention, will now be described. Specifically, the system 29 includes a slurry supply 30, a polishing device 31, and a light source 34 or 34'. The polishing device 31 includes the polishing article 24, such as a pad or belt. The polishing device 31 provides relative movement between the semiconductor wafer 20 and the polishing article 24 with a slurry 10 therebetween. The slurry 10 contains abrasive particles 11 and at least one mixed metal oxide and will be discussed in further detail below. The wafer 20, the polishing article 24 or both may be rotated during CMP. As shown, the polishing article 24 is carried by a polishing article support 25, such as a platen, which is rotated by a motor, not shown, via a shaft 26. The wafer 20 is carried by a wafer holder 21 which is rotated by a motor, not shown, via shaft 23.

The light source 34 may be a lamp or fiber optics, for example. The light source 34 may be provided adjacent the interface between the wafer 20 and the polishing article 20. Alternatively, as shown in FIG. 3, the light source 34' may be provided adjacent or below the polishing article support 25' opposite to the polishing article 24'. Thus, at least portions of the polishing article support 25' and the polishing article 24' may be formed of a transparent material, such as polyurethane, for example. Also, the light source 34 may be carried by the polishing article support 25. Additionally, intermittent light may be provided to enhance the photocatalytic process as would be appreciated by the skilled artisan. The light provided by the light source 34 or 34' is preferably ultraviolet.

Figure 5:
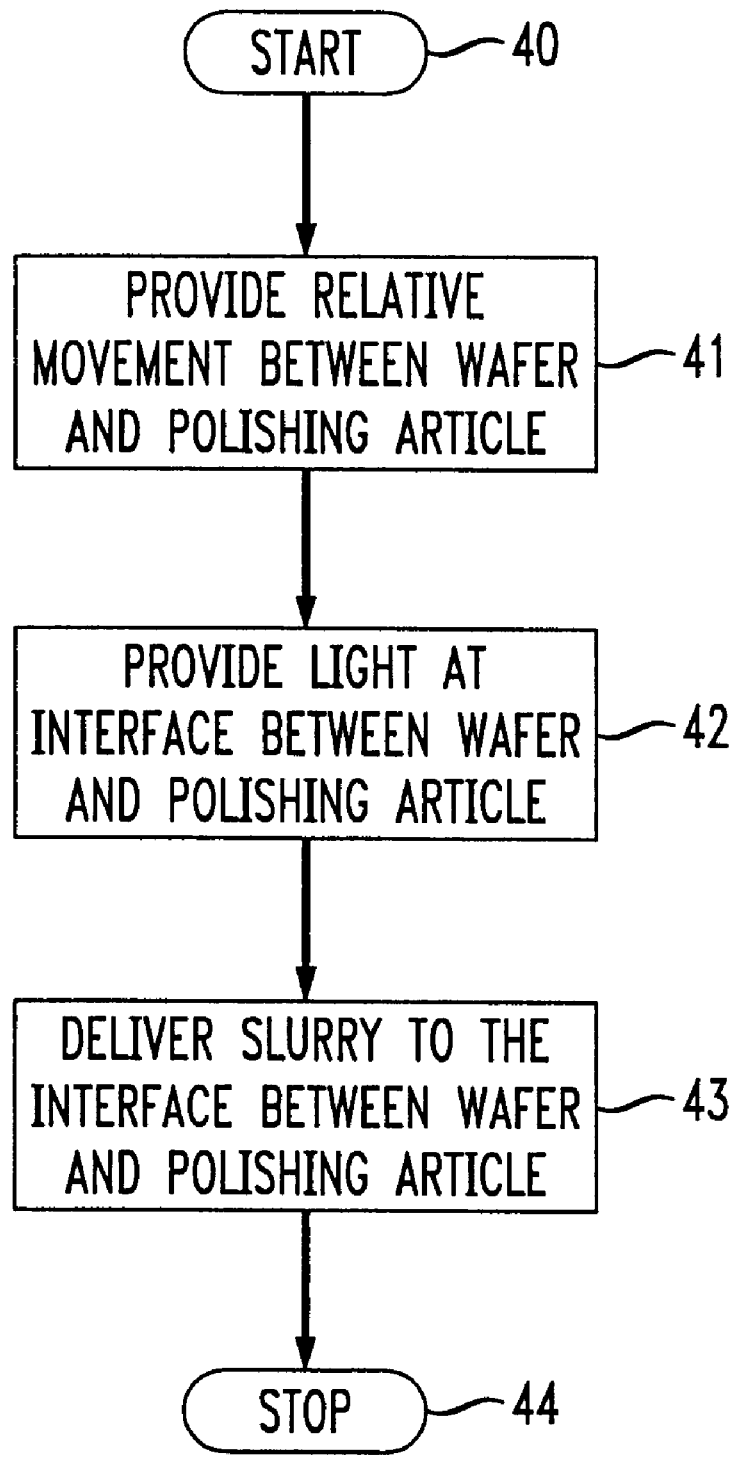
FIG. 5 is a flowchart illustrating the basic steps of chemically mechanically polishing using a slurry in accordance with the present invention.

Referring to FIGS. 5, the method for CMP begins at Block 40 and relative movement is provided between the semiconductor wafer 20 and the polishing article 24 (Block 41). For example, motors may rotate shafts 23 and 26 to thereby rotate the wafer 20 and the polishing article 24, respectively. At Block 42, light is provided at the interface between the wafer 20 and the polishing article 24. As discussed above, the light is preferably ultraviolet. Furthermore, at Block 43, the slurry 10 is delivered to the interface between the semiconductor wafer 20 and the polishing article 24 in the polishing device 31.

The CMP slurry 10 in accordance with the present invention includes an aqueous phase which is preferably an aqueous acidic phase. The slurry 10 includes abrasive particulates 11 comprised of metal oxides such as silica ($SiO_2$), alumina ($Al_2O_3$), titanium oxide ($TiO_2$), and cerium oxide ($CeO_2$) of a particle size of about 10 nm in an aqueous solution, for example, such as potassium hydroxide (KOH).

The slurry 10 may also include stabilizers, one or more oxidizing and/or complexing agents, and a suspension agent or surfactant. Such stabilizers may include ammonium chloride, such oxidizers may include ferric salts, and such complexing agents may include ethylene diamine tetra-acetate (edta), di-ethylene triamine penta-acidic acid (dtpa), 8-hydroxy quinoline, bi-pyridine, and ortho-phenanthroline, for example. A conventional surfactant, or surface wetting agent, may include an emulsion comprising mostly water, and also include fats/oils and alcohols/iso-alcohols, for example. The fat/oil serves to keep the abrasive particles in suspension, as would be appreciated by those skilled in the art. An emulsion is a two-phase medium including a liquid dispersed with or without an emulsifier in an immiscible liquid usually in droplets of larger than colloidal size.

Figure 2:
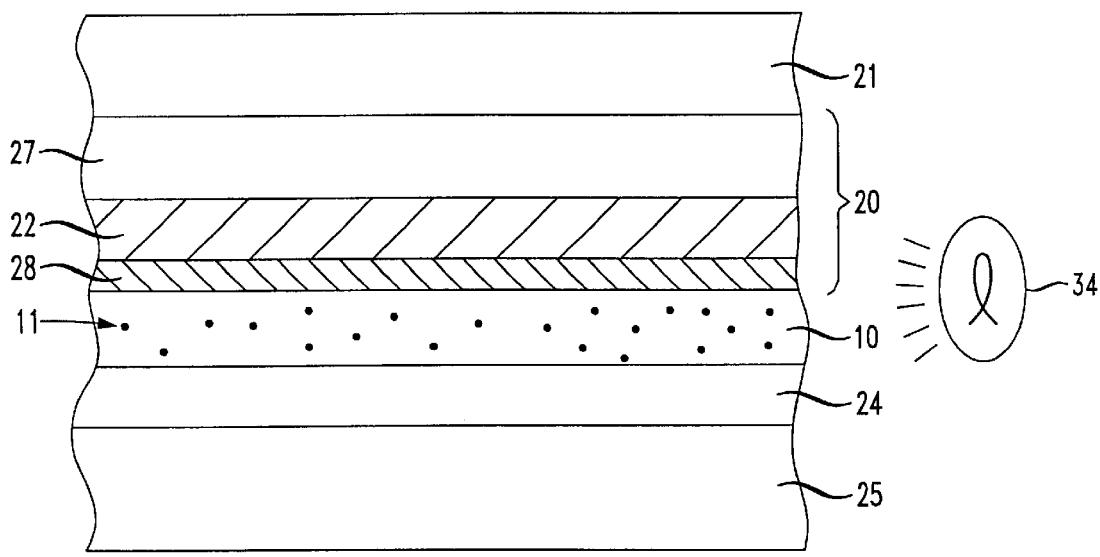
FIG. 2 is a schematic view of a CMP slurry at the interface of a semiconductor wafer and a polishing article in accordance with the embodiment shown in FIG. 1.
Figure 4:
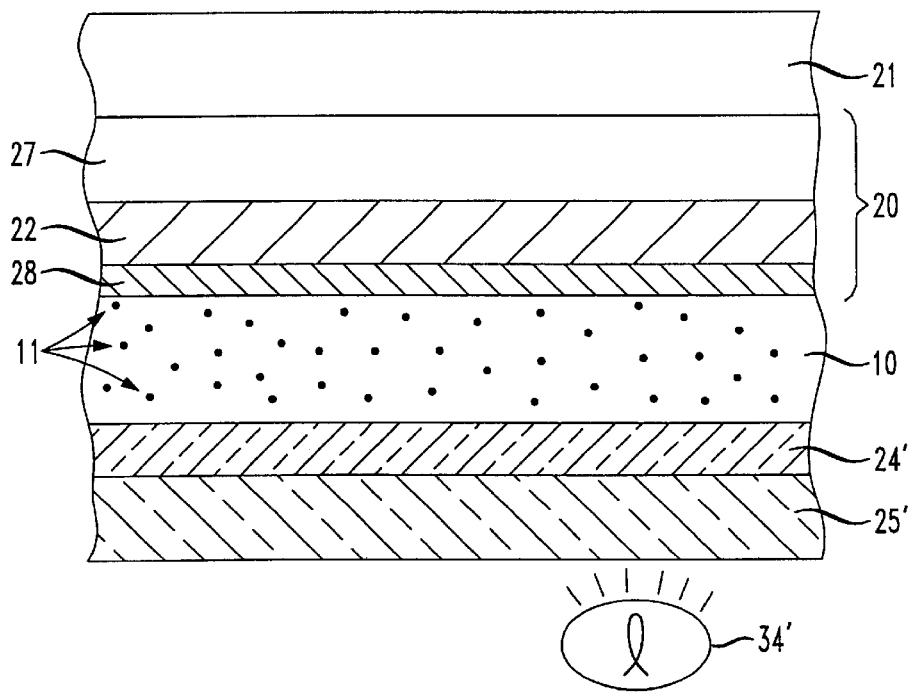
FIG. 4 is a schematic view of a CMP slurry at the interface of a semiconductor wafer and a polishing article in accordance with the embodiment shown in FIG. 3.

Referring to FIGS. 2 and 4, the semiconductor wafer 20 includes a dielectric layer 27 and a metal layer 22 which may include tungsten, aluminum, copper, tantalum, titanium, titanium nitride, tantalum nitride or any other metal commonly used in the production of integrated circuits. Metal particles are polished off the metal layer 22 during the CMP process using the slurry 10 at the interface between the semiconductor wafer 20 and a polishing article 24 or 24'.

Metal removal rates during CMP are limited by the rate of oxidation of the metal layer 22. Therefore, typical slurries include oxidizers to oxidize the metal because the metal oxides polish faster compared to the pure metal. However, in the present invention, the slurry 10 preferably comprises at least one mixed metal oxide to enhance oxidation of the metal of the semiconductor wafer 20. As, illustrated in FIGS. 2 and 4, the exposed outer layer of the metal layer 22 becomes a metal oxide layer 28 during oxidation just prior to being polished off during CMP.

The slurry 10 includes water and the at least one mixed metal oxide is preferably a photocatalyst for breaking down water into hydrogen and oxygen in the presence of light. This released oxygen significantly enhances the oxidation of the metal surface during CMP. Accordingly, faster removal rates can be achieved during CMP with the slurry according to the present invention.

For example, a CMP process for a layer of a semiconductor wafer 20 tungsten would typically be performed at a metal removal rate of about 100 Å per minute. With the addition of conventional oxidizers, the metal removal rate may be increased to about 2000 Å per minute. However, with a slurry 10 having mixed metal oxides in accordance with the present invention, the removal rate of tungsten is expected to be greater than 2000 Å per minute and would likely increase to about 3000–4000 Å per minute.

The at least one mixed metal oxide preferably comprises at least one of $SrTiO_3$, $CeTiO_3$, $BaTiO_3$, and $(Sr_xBa_{1-x})TiO_3$, for example, and may include an NiO coating. Of course the slurry 10 may include any mixed metal oxide which acts as a photocatalyst to break down water into hydrogen and oxygen in the presence of light. The slurry 10 may be acidic with the at least one mixed metal oxide being soluble in the slurry. Alternatively, the slurry 10 may be alkaline with the mixed metal oxide being insoluble in the slurry. Here, the mixed metal oxide may comprise abrasive particles 11. Of course other additives may be added to the slurry 10 as would be appreciated by the skilled artisan.

Additionally, when chemically mechanically polishing copper on a semiconductor wafer, a slurry typically includes corrosion inhibitors. However, because the oxidation rate of copper would be enhanced with the present invention, no corrosion inhibitors are necessary. In other words, the mixed metal oxides in the slurry 10 of the present invention enhance the oxidation rate of the copper; therefore, corrosion of the copper during CMP is substantially prevented and the need for corrosion inhibitors in the slurry is eliminated.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A chemical mechanical polishing (CMP) system for polishing a semiconductor wafer including metal, the system comprising:

a polishing device including a polishing article support, and a polishing article held by the polishing article support for relative movement with the semiconductor wafer; and a slurry provided at an interface between the polishing article and the semiconductor wafer, the slurry comprising abrasive particles and at least one mixed metal oxide to enhance oxidation of the metal of the semiconductor wafer, the at least one mixed metal oxide comprising at least one of $SrTiO_3$, $CeTiO_3$, $BaTiO_3$, and $(Sr_xBa_{1-x})TiO_3$.

2. A CMP system according to claim 1, further comprising a light source providing light at the interface between the polishing article and the semiconductor wafer.

3. A CMP system according to claim 2, wherein the light provided by the light source is ultraviolet.

4. A CMP system according to claim 2, wherein the light source is positioned adjacent the polishing article support opposite the polishing article; and wherein at least portions of the polishing article support and the polishing article are transparent.

5. A CMP system according to claim 2, wherein the light source is carried by the polishing article support; and wherein the polishing article is transparent.

6. A CMP system according to claim 1, wherein the at least one mixed metal oxide includes an NiO coating.

7. A CMP system according to claim 1, wherein the slurry is acidic and the at least one mixed metal oxide is soluble in the slurry.

8. A CMP system according to claim 1, wherein the slurry is alkaline and the mixed metal oxide is insoluble in the slurry.

9. A CMP system according to claim 8, wherein the at least one mixed metal oxide comprises abrasive particles.

10. A chemical mechanical polishing (CMP) system for polishing a semiconductor wafer including metal, the system comprising:

a polishing device including a polishing article support, and a polishing article held by the polishing article support for relative movement with the semiconductor wafer;

a slurry provided at an interface between the polishing article and the semiconductor wafer, the slurry comprising water, abrasive particles and at least one photocatalyst to enhance oxidation of the metal of the semiconductor wafer, the at least one photocatalyst comprising at least one mixed metal oxide comprising at least one of $SrTiO_3$, $CeTiO_3$, $BaTiO_3$, and $(Sr_xBa_{1-x})TiO_3$ for breaking down water into hydrogen and oxygen in the presence of light; and a light source providing light at the interface between the polishing article and the semiconductor wafer.

11. A CMP system according to claim 10, wherein the light provided by the light source is ultraviolet.

12. A CMP system according to claim 10, wherein the light source is positioned adjacent the polishing article support opposite the polishing article; and wherein at least portions of the polishing article support and the polishing article are transparent.

13. A CMP system according to claim 10, wherein the light source is carried by the polishing article support; and wherein the polishing article is transparent.

14. A CMP system according to claim 10, wherein the at least one mixed metal oxide includes an NiO coating.

15. A chemical mechanical polishing (CMP) slurry for polishing a semiconductor wafer including metal, the slurry comprising:

water;

abrasive particles in the water; and at least one mixed metal oxide in the water to enhance oxidation of the metal of the semiconductor wafer, the at least one mixed metal oxide comprising at least one of $SrTiO_3$, $CeTiO_3$, $BaTiO_3$, and $(Sr_xBa_{1-x})TiO_3$.

16. A CMP slurry according to claim 15, wherein the at least one mixed metal oxide is a photocatalyst for breaking down water into hydrogen and oxygen in the presence of light.

17. A CMP slurry according to claim 16, wherein the light is ultraviolet.

18. A CMP slurry according to claim 15, wherein the at least one mixed metal oxide includes an NiO coating.

19. A CMP slurry according to claim 15, wherein the slurry is acidic and the at least one mixed metal oxide is soluble in the slurry.

20. A CMP slurry according to claim 15, wherein the slurry is alkaline and the mixed metal oxide is insoluble in the slurry.

21. A CMP slurry according to claim 20, wherein the at least one mixed metal oxide comprises abrasive particles.

22. A CMP slurry according to claim 15, wherein the slurry further comprises a stabilizer, a surfactant, and a suspension agent.

23. A CMP slurry according to claim 15, wherein the metal comprises at least one of tungsten, aluminum, copper, titanium, tantalum, titanium nitride and tantalum nitride.

24. A method of chemical mechanical polishing (CMP) a semiconductor wafer including metal, the method comprising the steps of:

providing relative movement between the semiconductor wafer and a polishing article; and delivering a slurry to an interface between the semiconductor wafer and the polishing article;

the slurry comprising abrasive particles and at least one mixed metal oxide to enhance oxidation of the metal of the semiconductor wafer, the at least one mixed metal oxide comprising at least one of $SrTiO_3$, $CeTiO_3$, $BaTiO_3$, and $(Sr_xBa_{1-x})TiO_3$.

25. A method according to claim 24, further comprising the step of providing light at the interface between the polishing article and the semiconductor wafer.

26. A method according to claim 25, wherein the light is ultraviolet.

27. A method according to claim 24, wherein the at least one mixed metal oxide includes an NiO coating.

28. A method according to claim 24, wherein the at least one mixed metal oxide comprises abrasive particles.

29. A method of chemical mechanical polishing (CMP) a semiconductor wafer including metal, the method comprising the steps of:

provproviding relative movement between the semiconductor wafer and a polishing article;

providing light at the interface between the polishing article and the semiconductor wafer; and delivering a slurry to the interface between the semiconductor wafer and the polishing article;

the slurry comprising water, abrasive particles and at least one photocatalyst to enhance oxidation of the metal of the semiconductor wafer, the at least one photocatalyst comprising a mixed metal oxide for breaking down water into hydrogen and oxygen in the presence of light, the at least one mixed metal oxide comprising at least one of $SrTiO_3$, $CeTiO_3$, $BaTiO_3$, and $(Sr_xBa_{1-x})TiO_3$.

30. A method according to claim 29, wherein the light is ultraviolet.

31. A method according to claim 29, wherein the at least one mixed metal oxide includes an NiO coating.

32. A method according to claim 29, wherein the at least one mixed metal oxide comprises abrasive particles.

* * * * *